US010162924B1

(12) United States Patent
Singhal et al.

(10) Patent No.: US 10,162,924 B1
(45) Date of Patent: Dec. 25, 2018

(54) METHOD AND APPARATUS FOR PERFORMING LARGE SCALE CONSENSUS BASED CLUSTERING

(71) Applicant: Altera Corporation, San Jose, CA (US)

(72) Inventors: Love Singhal, San Jose, CA (US); Mahesh Iyer, Fremont, CA (US); Saurabh Adya, San Jose, CA (US)

(73) Assignee: Altera Corporation, San Jose, CA (US)

( * ) Notice: Subject to any disclaimer, the term of this patent is extended or adjusted under 35 U.S.C. 154(b) by 19 days.

(21) Appl. No.: 15/262,939

(22) Filed: Sep. 12, 2016

(51) Int. Cl.
*G06F 17/50* (2006.01)

(52) U.S. Cl.
CPC ........ *G06F 17/5054* (2013.01); *G06F 17/505* (2013.01); *G06F 17/5072* (2013.01); *G06F 17/5077* (2013.01); *G06F 17/5081* (2013.01); *G06F 17/5027* (2013.01)

(58) Field of Classification Search
CPC ............. G06F 17/5027; G06F 17/5054; G06F 17/505; G06F 17/5072; G06F 17/5077; G06F 17/5081

USPC ............ 716/116, 121, 128, 102; 703/15, 16
See application file for complete search history.

(56) References Cited

U.S. PATENT DOCUMENTS

| | | | | |
|---|---|---|---|---|
| 7,020,864 | B1 * | 3/2006 | Loong ................. | G06F 17/5054 716/103 |
| 7,100,141 | B1 * | 8/2006 | Ratchev ............. | G06F 17/5054 716/117 |
| 7,493,585 | B1 * | 2/2009 | Ahmed ............... | G06F 17/5054 716/105 |
| 9,971,862 | B2 * | 5/2018 | Tang .................. | G06F 17/5054 |
| 2003/0135724 | A1 * | 7/2003 | Krishnamurthy ..... | G06F 9/3891 712/245 |
| 2016/0063168 | A1 * | 3/2016 | Tang .................. | G06F 17/5077 716/128 |
| 2017/0188204 | A1 * | 6/2017 | Kela ....................... | H04W 4/08 |

* cited by examiner

*Primary Examiner* — Phallaka Kik
(74) *Attorney, Agent, or Firm* — Compass IP Law PC

(57) ABSTRACT

A method for designing a system on a target device includes identifying a candidate cluster for a node in the system based on a gain value that quantifies utility for the candidate cluster. The candidate cluster is designated as a final cluster for the node when the candidate cluster has a highest gain value among other candidate clusters for each node in the candidate cluster.

19 Claims, 13 Drawing Sheets

METHOD AND APPARATUS FOR PERFORMING LARGE SCALE CONSENSUS BASED CLUSTERING

FIELD

Embodiments of the present disclosure relate to tools for designing a system on a target device. More specifically, embodiments of the present disclosure relate to a method and apparatus for performing large scale consensus based clustering in a compilation flow.

BACKGROUND

Target devices such as field programmable gate arrays (FPGAs), structured application specific integrated circuits (ASICs), and ASICs are used to implement large systems that may include million of gates and megabits of embedded memory. The complexity of a large system often requires the use of electronic design automation (EDA) tools to create and optimize a design for the system onto physical target devices. Among the procedures performed by EDA tools in a computer aided design (CAD) compilation flow is hardware description language (HDL) compilation. HDL compilation involves performing synthesis, placement, routing, and timing analysis of the system on the target device.

Clustering, also referred to as "packing", is one procedure that is performed during HDL compilation. Clustering involves grouping basic logic elements onto resources of a target device. Clustering in an HDL compilation share objectives that are found in general cluster analysis such as the goal of grouping a set of objects in a manner that objects in a same group are more similar to each other than to those in other groups.

Traditional EDA tools perform clustering by utilizing a greedy algorithm that follows the problem solving heuristic of making a locally optimal choice at each stage with the hope of finding a global optimum. In many situations, the greedy algorithm does not produce an optimal solution, but instead yields locally optimal solutions. It has been observed that the solutions found for clustering problems would be influenced by the stalling points chosen for the greedy algorithm and earlier decisions made by the greedy algorithm.

SUMMARY

According to an embodiment of the present disclosure, a methodology for performing large scale consensus based clustering is disclosed. The methodology independently creates and identifies a candidate cluster that is best for each node. Whether a candidate cluster is best for a node may be measured by a gain value. A final cluster is selected for a plurality of nodes by allowing the nodes to negotiate among themselves. During negotiation, each node selects its candidate cluster with the highest gain value as a choice for the final cluster. Nodes reach a decision by consensus for the choice of the final cluster. Nodes in a final cluster are removed for consideration when forming new clusters. The methodology terminates when all nodes have reached consensus on a final cluster.

According to an embodiment of the present disclosure, a method for designing a system on a target device includes identifying a candidate cluster for a node in the system based on a gain value that quantifies utility for the candidate cluster. The candidate cluster may be required to be a legal candidate cluster. The candidate cluster is designated as a final cluster for the node when the candidate cluster has a highest gain value among other candidate clusters for each node in the candidate cluster. According to an embodiment of the present disclosure, the gain value accounts for one or more of a number of pins shared between the nodes in the candidate cluster, criticality and slack between the nodes in the candidate cluster, and a distance between the nodes in the candidate cluster. Identifying the candidate cluster may include receiving one or more candidate clusters from neighboring nodes, adopting one or more candidate clusters from the neighboring nodes, identifying a gain value for each of the candidate clusters, and designating a predetermined number of the candidate clusters of the node with a highest gain value as candidate clusters of the node. Adopting the one or more candidate clusters from the neighboring nodes may be achieved by inserting the node to the candidate clusters from the neighboring nodes, ensuring that the resulting clusters satisfy legality rules of the underlying target device architecture, and forming new legal candidate clusters for the node.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

DETAILED DESCRIPTION

In the following description, for purposes of explanation, specific nomenclature is set forth to provide a thorough understanding of embodiments of the present disclosure. it will he apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

Figure 1:
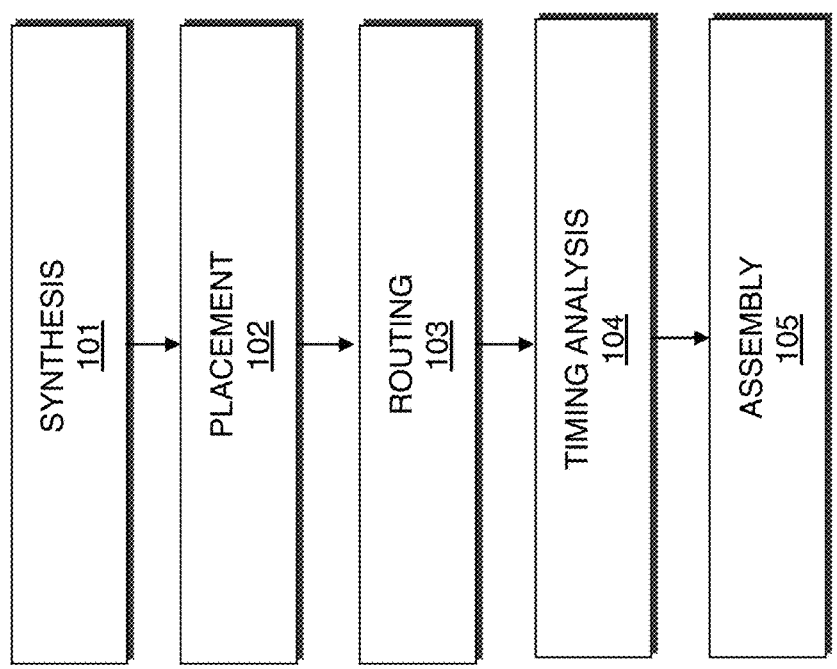
FIG. 1 is a flow chart illustrating a method for designing a system on a target device according to an exemplary embodiment of the present disclosure.

FIG. 1 is a flow chart illustrating a method for designing a system on a target device according to an exemplary embodiment of the present disclosure. The target device may be a field programmable gate array (FPGA), application specific integrated circuit (AMC), a structured ASIC, or other device. According to one embodiment, the procedure illustrated in FIG. 1 may be performed by a computer aided design (CAD)/electronic design automation (EDA) tool implemented on a computer system.

At 101, a design for the system is synthesized. The specification for the system may be provided though a design entry tool. The specification may describe components and interconnections in the system. According to an embodiment of the present disclosure, the design entered may be in register transfer level (RTL) in a hardware description language (HDL). Design constraints may also be provided for synthesis. Synthesis includes generating a logic design of the system to be implemented by the target device. According to an embodiment of the present disclosure, synthesis generates an optimized logical representation of the system from an HDL design definition. The optimized logical representation of the system may include a representation that has a minimized number of functional blocks such as logic gates, logic elements, and registers required for the system, Synthesis also includes technology mapping the optimized logical representation. Technology mapping includes determining how to implement logic gates and logic elements in the optimized logic representation with the types or categories of resources available on the target device. The resources available on the target device may be referred to as "cells" or "components" and may include logic array blocks (LABs), adaptive logic modules (ALMs) registers, memories, digital signal processing blocks, input output elements, look up tables, and other components. According to an embodiment of the present disclosure, a netlist is generated from mapping. This netlist may be an optimized technology-mapped netlist generated from the HDL. It should be appreciated that the netlist generated from synthesis identifies one or more clock networks for the system. The identified clock networks may include a plurality of input output pins, phase-locked loops (PLLs), logic, registers (flip-flops), and other circuitry or components.

At 102, the system is placed. According to an embodiment of the present disclosure, placement involves placing the technology-mapped logical system design on the target device. Placement includes fitting the system on the target device by determining which specific resources on the target device are to be assigned to and implemented by the technology-mapped netlist determined during synthesis. Placement may include clustering which involves grouping logic elements together to form the logic clusters present on the target device. It should be appreciated that in alternate embodiments of the present disclosure, clustering may be performed before or after placement.

At 103, the placed design is routed. During routing, routing resources on the target device are allocated to provide interconnections between logic gates, logic elements, and other components on the target device. Routability optimization may also be performed on the placed logic design. According to an embodiment of the present disclosure, the goal of routability optimization is to reduce the amount of wiring used to connect components in the placed logic design, while maintaining other metrics like timing to the best extent possible. Routability optimization may include performing fanout splitting, logic duplication, logical rewiring, or other procedures. It should be appreciated that one or more of the procedures may be performed on the placed logic design.

At 104, timing analysis is performed on the design of the system generated from procedures 101-103. According to an embodiment of the present disclosure, the timing analysis determines whether timing constraints of the system are satisfied and generates signoff-quality timing reports for the user.

At 105, assembly is performed. The assembly procedure involves creating a data file that includes information determined by the procedures described at 101-104. The data file may be a bit stream that may be used to program a target device. By programming the target with the data file, components on the target device are physically transformed to implement the system.

Figure 2:
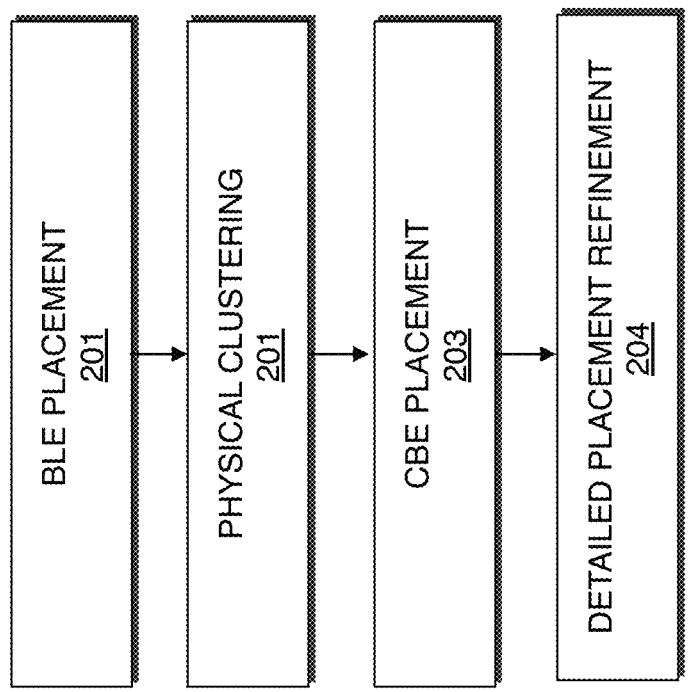
FIG. 2 is a flow chart illustrating a method for performing placement on a target device according to an exemplary embodiment of the present disclosure.

FIG. 2 is a flow chart illustrating a method for performing placement on a target device according to an exemplary embodiment of the present disclosure. The procedures illustrated in FIG. 2 may be used to implement procedure 102 (shown in FIG. 1). At 201, basic logic element (BLE) placement is performed. Basic logic elements (BLEs) may include registers, look up tables (LUTs), block RAMs, DSPs, and/or other components from a synthesis netlist. Placement of the basic logic elements involves assigning a general location for the basic logic elements on a target device. The general location may include a coordinate assignment which specifies a coordinate or range of coordinates.

It should be appreciated that basic logic elements placement may utilize one or more different types of placement algorithms. According to an embodiment of the present disclosure, analytic placement is used to place the BLEs. Analytic placement models a placement problem as systems of equations to which standard numerical solvers are applied. Analytic placement uses solvers that require the placer objective function to be both continuous and differentiable. It should be appreciated that other types of placement algorithms, such as simulated annealing or other algorithm may also be used in addition or in place of analytic placement at initial placement.

At 202, physical clustering is performed. Physical clustering involves grouping the BLEs together to form logic clusters or cluster block elements (CBEs). The cluster block elements are implemented by resources on the target device. in one embodiment, the cluster block elements are implemented by adaptive logic modules (ALMs) and logic array blocks (LABs) on the target device. It should be appreciated that other resources or combination of resources may be used to implement the clustered block elements. According to an embodiment of the present disclosure, physical clustering receives as inputs a logic netlist that identifies basic logic elements in the system, a basic logic element level placement, and timing information for the placed netlist. According to an embodiment of the present disclosure, the objectives of physical clustering includes identifying legal clustered block elements such as LABs to implement the basic logic elements that satisfy all the legality rules of the underlying target device architecture, meet physical constraints such as pre-defined region placement areas, minimize a number of inter LAB nets, minimize placement deviation from the basic logic element level placement, find a best placement for clusters, and manage clustering for a large number of basic logic elements.

At 203, cluster block element placement is performed. The cluster block elements identified at physical clustering 202 are placed on the target device. According to an embodiment of the present disclosure, physical locations on the target device are assigned to the clustered block elements by assigning cluster block elements to physical LABs on the target device. This process also involves a legalization procedure to ensure that the resulting placement of the clustered block elements is physically legal on the target device, satisfying all the chip-level legality rules of the underlying target device architecture.

At 204, detailed placement refinement is performed. Detailed placement involves further refining earlier generated placement results. According to an embodiment of the present disclosure, detailed placement ay change a location of a basic logic element or change a definition of a clustered block element. For example a look up table or register from a first LAB may be moved to a second LAB on the target device in response to optimizing metrics like timing, wiring usage, routing congestion, and/or other criteria.

It should be appreciated that physical synthesis optimizations may be performed before and/or after one or more of the procedures in FIG. 2. Physical synthesis optimizations improve timing closure by reducing a number of critical paths. Physical synthesis optimizations may include logic replication, combinational logic resynthesis, local re-wiring, register retuning ("netlist retiming"), and other procedures.

Figure 3:
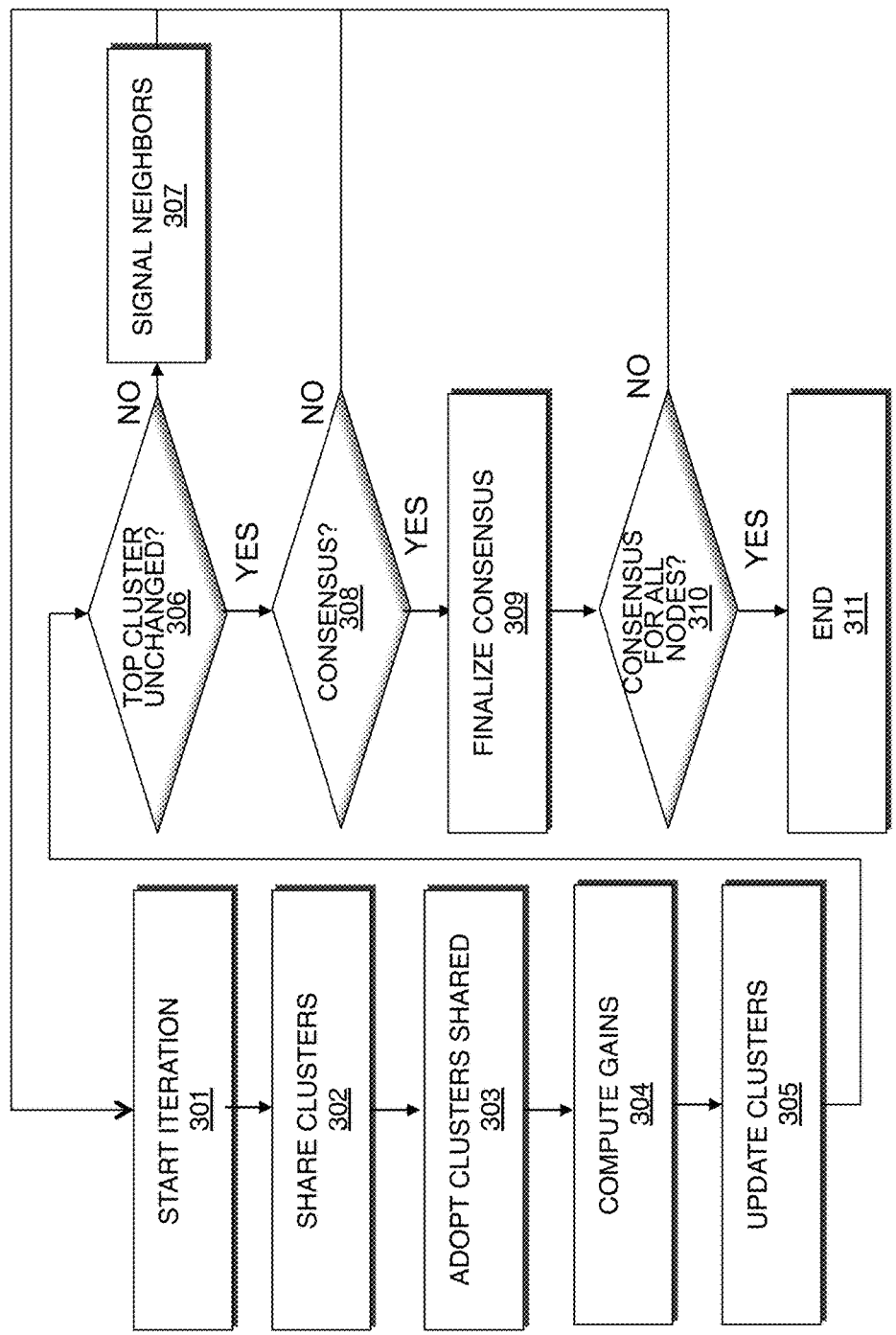
FIG. 3 is a flow chart illustrating a method for performing physical clustering according to an exemplary embodiment of the present disclosure.

FIG. 3 is a flow chart illustrating a method for performing physical clustering according to an exemplary embodiment of the present disclosure. The procedures illustrated in FIG. 3 may be used to implement procedure 201 (shown in FIG. 2). When used to implement procedure 201, the "nodes" referred to in FIG. 3 are basic logic elements from a synthesis netlist, and the "clusters" referred to in FIG. 3 are groups of basic logic elements assigned to a logic array block. According to an embodiment of the present disclosure, the procedures illustrated in FIG. 3 are performed for each basic logic element in a netlist in order to identify a final cluster for the basic logic element. At 301, an iteration for physical clustering is started for a node. At an initial iteration, a candidate cluster for the node would include the node.

At 302, the identity of the candidate clusters for the node is shared with its neighboring nodes, and the identity of the candidate clusters of neighboring nodes are shared with the node. According to an embodiment of the present disclosure, a neighboring node may be any node that shares a physical or logic connection with the node. A logical connection represents an electrical wiring connection between two nodes. A physical connection represents a notion that the placement of the two nodes are within some physical proximity of each other.

At 303, the candidate clusters of the neighboring nodes are adopted by the node. According to an embodiment of the present disclosure, adopting the candidate clusters of the neighboring nodes expands the set of candidate clusters associated with the node to include all of the clusters of its neighbors and it may be determined that the node should be added to an adopted candidate cluster.

At 304, a gain value is computed for each of the candidate clusters of the node. According to an embodiment of the present disclosure, the gain value quantifies a utility of a candidate cluster. The gain value may reflect attributes such as a number of pins shared between nodes in a candidate clusters, criticality and slack between the nodes in the candidate cluster, a distance between the nodes in the candidate cluster, and/or other characteristics. Slack reflects an amount of time violation on a netlist edge between nodes given a frequency target for a circuit. The gain value for a cluster will be the same for each node it is computed for. From the perspective of a node, its best candidate cluster ("top cluster") is the candidate cluster with the highest gain value.

At 305, the candidate clusters corresponding to the node are updated. According to an embodiment of the present disclosure, the candidate clusters may be updated by removing candidate clusters having nodes that have already decided a final cluster. Alternatively, new candidate clusters may be created by removing nodes that have already decided a final cluster. The candidate clusters may also be updated by retaining only a predetermined number of candidate clusters that have better gain values compared to the discarded candidate clusters. According to an embodiment of the present disclosure, whether a gain value is "better" may be determined by its size in magnitude.

At 306, it is determined. whether a top cluster, having a highest gain value, is unchanged from a previous iteration. If the top cluster has changed, control proceeds to 307. If the top cluster has not changed, control proceeds to 308. According to an embodiment of the present disclosure, control may also determine whether candidate clusters have been updated from neighboring nodes. If candidate clusters have been updated from neighboring nodes, control may return to 301 via 307 instead of proceeding to 308.

At 307, neighbors of the node are signaled to inform them that the candidate clusters have been updated. The neighbors are requested to start a new iteration in order to receive identities of updated candidate clusters and new top clusters.

At 308, it is determined whether there is a consensus as to which candidate cluster to designate as a final cluster. According to an embodiment of the present disclosure, a consensus is formed when a top cluster for a node is also the top cluster for all nodes in the top cluster. If consensus has not been established, control returns to 301. If consensus has been established, control proceeds to 309.

At 309, consensus is finalized. According to an embodiment of the present disclosure, consensus is finalized by designating the candidate cluster as the final cluster. The nodes in the final cluster are made unavailable for forming candidate clusters for other nodes. The identities of these unavailable nodes are transmitted to other nodes in the system so that candidate clusters for the nodes may be updated.

At 310, it is determined whether consensus has been established for all nodes in the system. Consensus for a plurality of nodes in the system may be established when a final cluster is designated for the plurality of nodes. If consensus has not been established for all of the nodes in the system, control proceeds to 301. A thread or processor resource assigned to the previous node may be assigned to a new node to perform clustering beginning at procedure 301. If consensus has been established for all of the nodes in the system, control proceeds to 311 where the flow is terminated.

Figure 4:
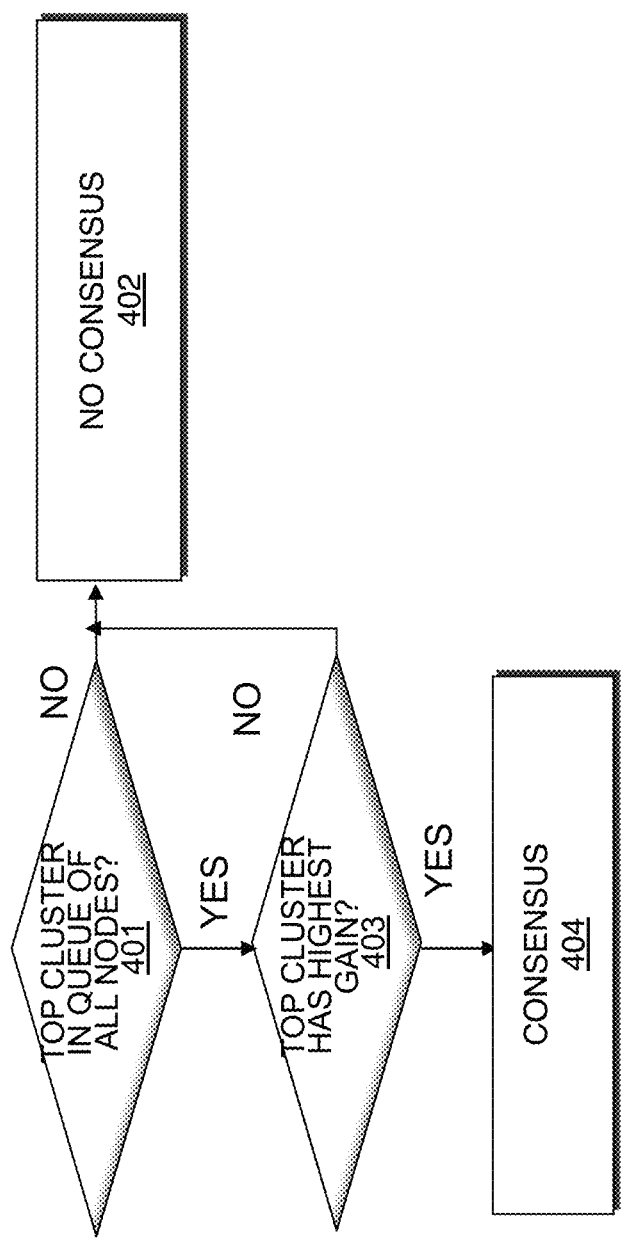
FIG. 4 is a flow chart illustrating a method for determining whether consensus exists for identifying a cluster for a plurality of nodes according to an exemplary embodiment of the present disclosure.

FIG. 4 is a flow chart illustrating a method for determining whether consensus exists for identifying a cluster for a plurality of nodes according to an exemplary embodiment of the present disclosure. The procedures illustrated in FIG. 4 may be used to implement procedure 308 (shown in FIG. 3). At 401, it is determined whether a top cluster for a node, which may be a candidate cluster for the node which has a highest gain value among all candidate clusters for the node, is also in a queue of candidate clusters for all other nodes in the top cluster. If the top cluster for the node is not in a queue of candidate clusters for all other nodes in the top cluster, control proceeds to 402. If the top cluster for the node is also in a queue of candidate clusters for all other nodes in the top cluster, control proceeds to 403.

At 402, no consensus has been established among other nodes as to which candidate cluster to designate as the final cluster for all nodes in the cluster.

At 403, it is determined whether the top cluster for the node also has the highest gain among other candidate clusters for all other nodes in the top cluster. If it is determined that the top cluster for the node does not have the highest gain among other candidate clusters for all other nodes in the top cluster, control proceeds to 402. If it is determined that the top cluster for the node does also has the highest gain among other candidate clusters for all other nodes in the top cluster, control proceeds to 404.

At 404, it is determined that consensus exists for designating the top cluster for the node as the final cluster for all the nodes in the top cluster.

FIGS. 1-4 are flow charts that illustrate embodiments of the present disclosure. The procedures described in these figures may be performed by an EDA tool implemented by a computer system. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques. It should be further appreciated that although the method of performing clustering has been described with reference to performing placement in a compilation flow, the clustering technique described can also be applied to other applications.

According to an embodiment of the present disclosure, the procedures described with reference to FIGS. 3 and 4 may be performed for each node in a system by a separate processor, processor core, or processor resource executing a unique processor thread. This would facilitate parallelism and expedite completion of the clustering procedure. it should be appreciated that information regarding the identities of candidate clusters, and nodes that have reached consensus and are no longer available to be in a candidate cluster may be communicated between nodes using distributed message passing system or other technique.

Figure 5A:
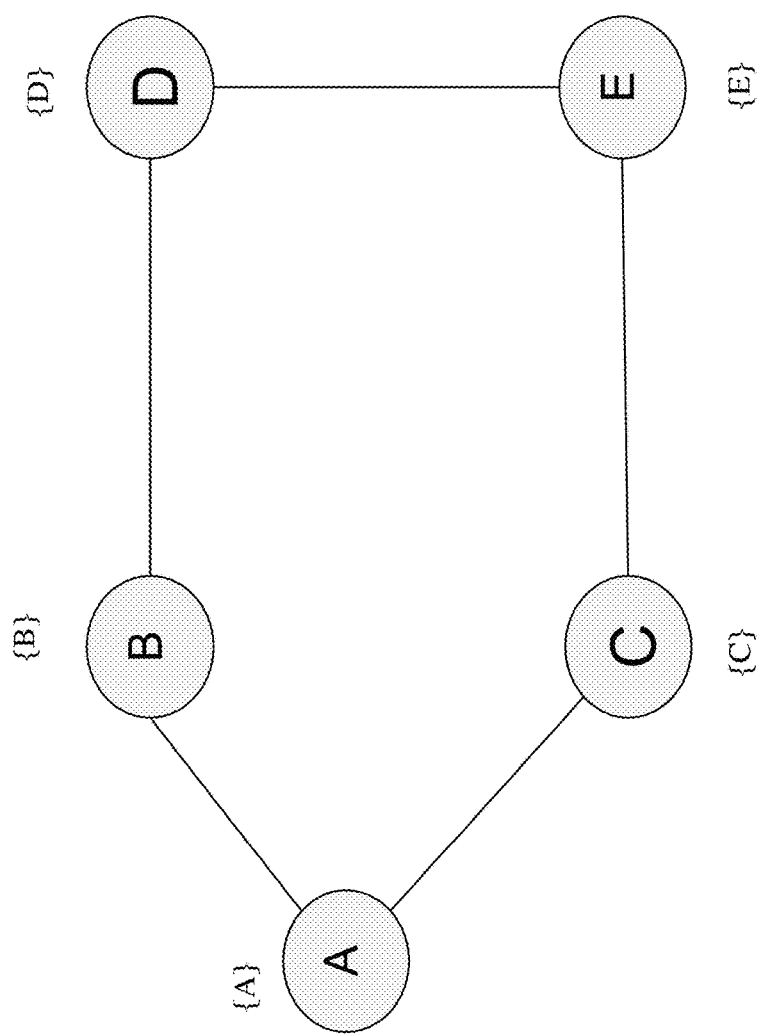
FIGS. 5A-5F illustrate an example of performing clustering according to an exemplary embodiment of the present disclosure.

FIGS. 5A-5F illustrate an example of performing clustering according to an exemplary embodiment of the present disclosure. FIG. 5A illustrates a system that includes five nodes, nodes A, B, C, D, and E. Referring to FIG. 3, at an initial iteration 301, the candidate cluster for each node includes only the node. FIG. 5A illustrates that node A includes candidate cluster {A}. Node B includes candidate cluster {B}. Node C includes candidate cluster {C}. Node D includes candidate cluster {D}. Node E includes candidate cluster {E}.

Figure 5B:
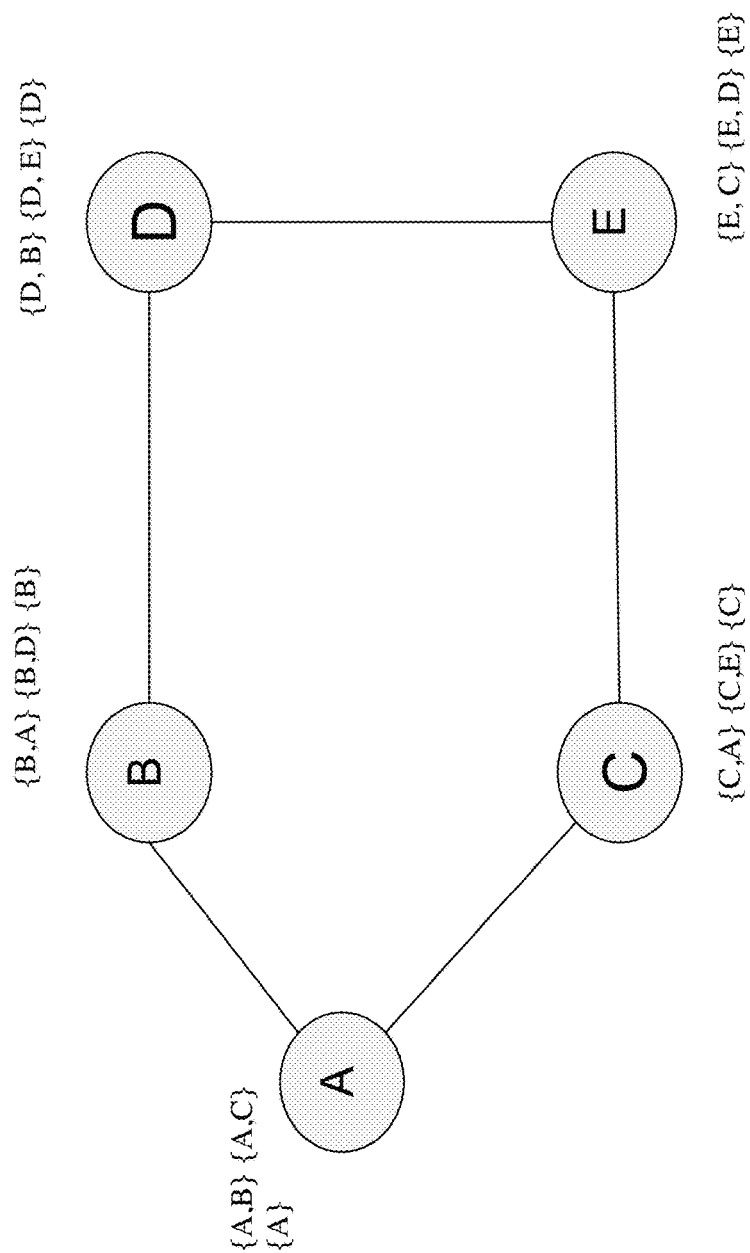

Referring to FIG. 3, after clusters from neighboring nodes are shared at 302, each node adopts the shared clusters of its neighbors at 303, and gains are computed for each candidate cluster at 304, the candidate clusters corresponding to each of the nodes are updated at 305. FIG. 5B illustrates that node A now includes nodes {A,B}, {A,C}, and {A}. Node B includes nodes {B,A}, {B,D}, and Node C includes nodes {C,A}, {C,E}, and {C}. Node D includes nodes {D,B}, {D,E}, and {D}. Node E includes nodes {E,C}, {E,D}, and {E}. As shown, each nodes has adopted the clusters from its neighbors and the candidate clusters for each node are ordered from highest gain value to lowest gain value (gain values are not shown). In this example, the size of the queue for storing candidate cluster is 3. As such, during this iteration of clustering, all shared candidate clusters remain in the queue of each node regardless of its computed gain.

Referring to FIG. 3, since the top cluster for nodes A-E have changed, control signals to its neighbors to inform them that the candidate clusters have been updated at 307. All of the nodes start a new iteration at 301.

Figure 5C:
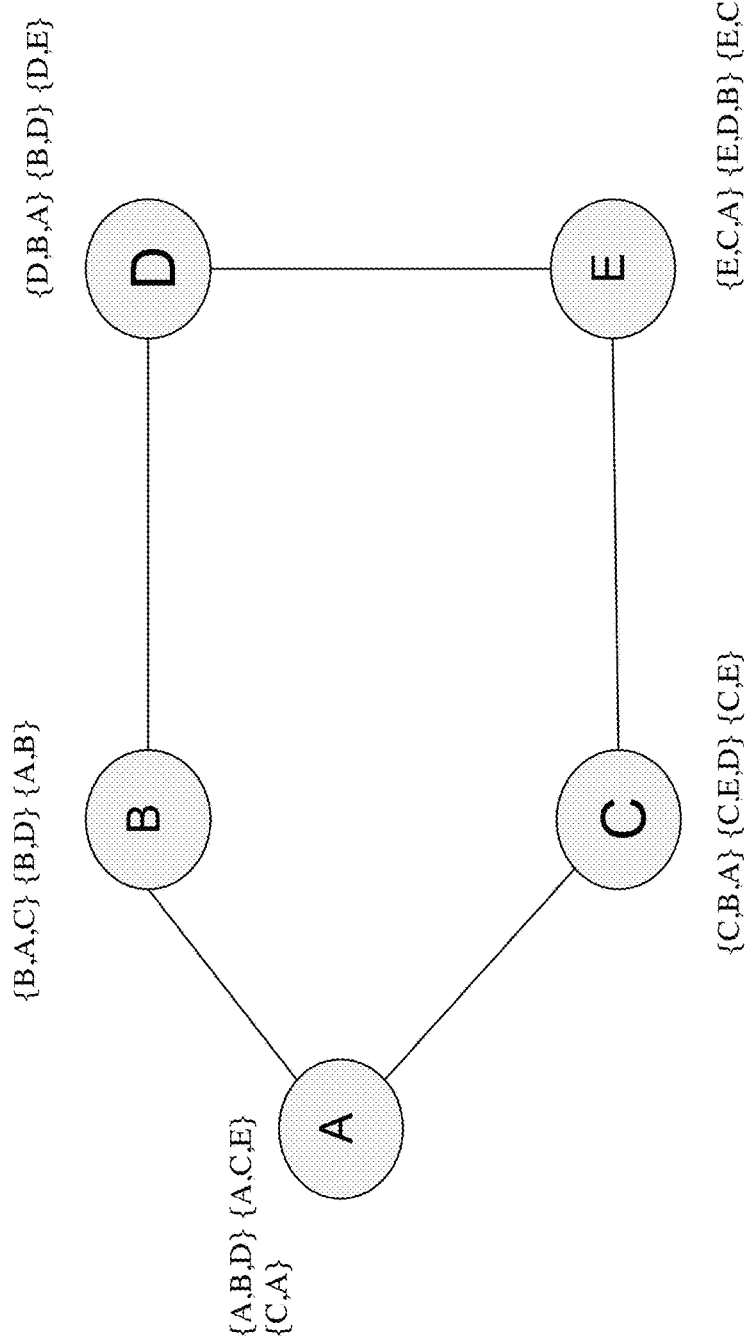

After clusters from neighboring nodes are shared at 302. each node adopts the shared clusters of its neighbors at 303, and gains are computed for each candidate cluster at 304, the candidate clusters corresponding to each of the node are updated at 305. FIG. 5C illustrates that node A includes nodes {A,B,D}, {A,C,E}, and {C,A}. Node B includes nodes {B,A,C}, {B,D}, and {A,B}. Node C includes nodes {C,B,A}, {C,E,D}, and {C,E}. Node D includes nodes {D,B,A}, {B,D}, and {D,E}. Node E includes nodes {E,C, A}, {E,D,B}, and {E,C}. Each node adopts the clusters from its neighbors, inserts itself into each of these clusters, and computes the gains of the resulting clusters that satisfy all the legality rules of the underlying target device architecture. The resulting legal candidate clusters for each node are then ordered from highest gain value to lowest gain value. Since the size of the queue for storing candidate cluster is 3, only the 3 candidate clusters having the highest gain value are saved for each node. For example, even though candidate clusters {D,E} was shared with node B at 302, and adopted by node B as {B,D,E} at 303, since it does not have a higher gain value than candidate clusters {B,A,C}, {B,D}, and {A,B}, it is not stored in the queue for node B.

Referring to FIG. 3, since the top cluster for nodes A-E have changed, control signals to its neighbors to inform them that the candidate clusters have been updated at 307. All of the nodes start a new iteration at 301.

Figure 5D:
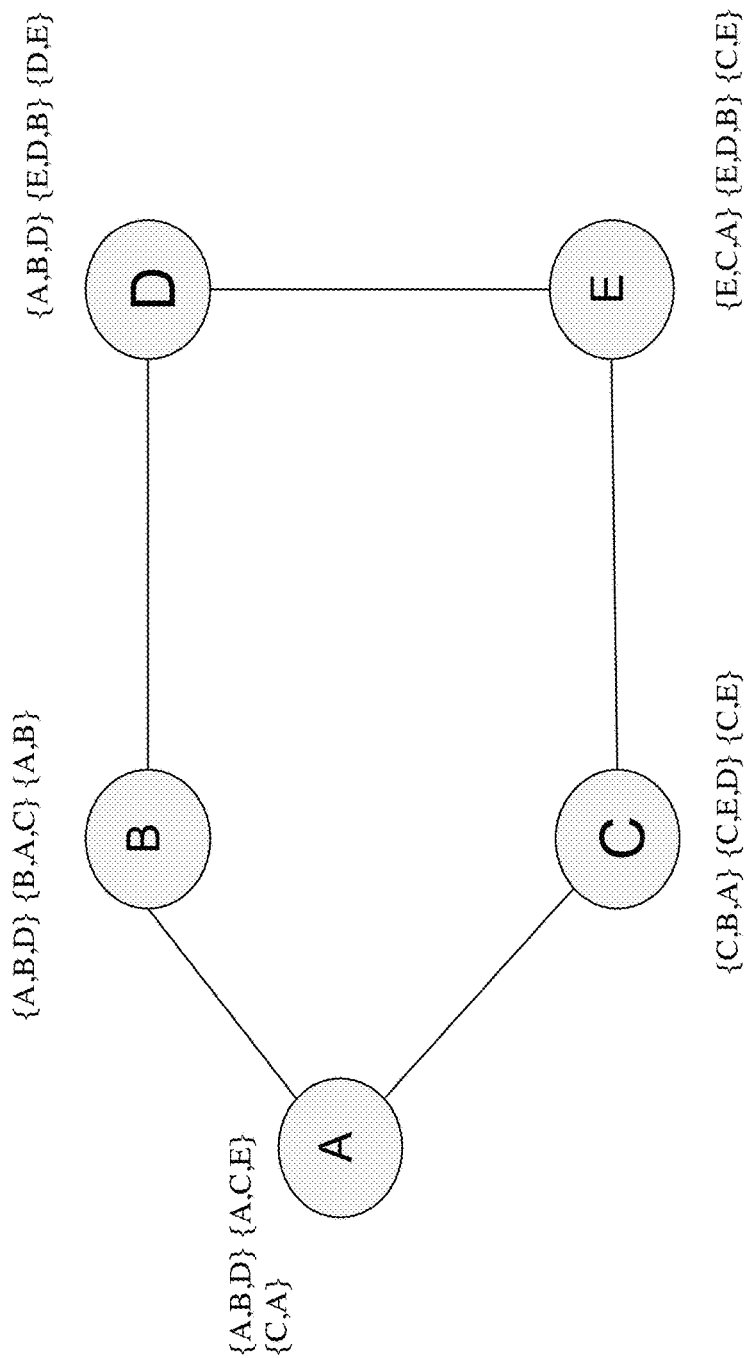

After clusters from neighboring nodes are shared at 302, each node adopts the shared clusters of its neighbors 303, and gains are computed for each candidate cluster at 304, the candidate clusters corresponding to each of the node are updated at 305. FIG. 5D illustrates that node A includes nodes {A,B,D}, and {A,C,E}. Node B includes nodes {A,B, D}, {B,A,C}, and {A,B}. Node C includes nodes {C,B,A}, {C,E,D}, and {C,E}. Node D includes nodes {A,B,D}, {E,D,B}, and {D,E}. Node E includes nodes {E,C,A}, {E,D,B}, and {E,C}. Each node has adopted the clusters from its neighbors and the candidate clusters for each node are ordered from highest gain value to lowest gain value. Since the size of the queue for storing candidate cluster is 3, only the 3 candidate clusters having the highest gain value are saved for each node.

Referring to FIG. 3, since the top cluster for node C has not changed, control determines whether there is consensus between other nodes as to which cluster should be a final cluster for node C at 308. Referring to FIG. 4, control determines that the top cluster in node C is {C,B,A} at 401. Cluster {C,B,A}, however, is not in the queue of node A, and is not the top cluster for node B. Therefore there is no consensus that candidate cluster {C,B,A} should be a final cluster for node C.

Since the top cluster for node E has not changed, control determines whether Control also determines whether there is consensus between other nodes as to whichcluster should be a final cluster for node E at 308. Referring to FIG. 4, control determines that the top cluster in node E is {E,C,A} at 401. Cluster {E,C,A}, however, is not in the queue of node C and therefore there is no consensus that candidate cluster {E,C, A} should be a final cluster for node E.

Since the top cluster for nodes A has not changed, control determines whether there is a consensus between other nodes as to which cluster should be a final cluster for node A at 308. Referring to FIG. 4, control determine that the top cluster in node A is {A,B,D} and that that candidate cluster {A,B,D} is also in the queues of nodes B and D at 401, and that candidate cluster {A,B,D} has the highest gain value among the candidate clusters in the queues of nodes A, B, and D at 403. As such, there is consensus among nodes A, B, and D that candidate cluster {A,B,D} should be their final cluster. Referring back to FIG. 3, consensus is finalized by informing other nodes that nodes A, B, and D are not available for forming candidate clusters.

Figure 5E:
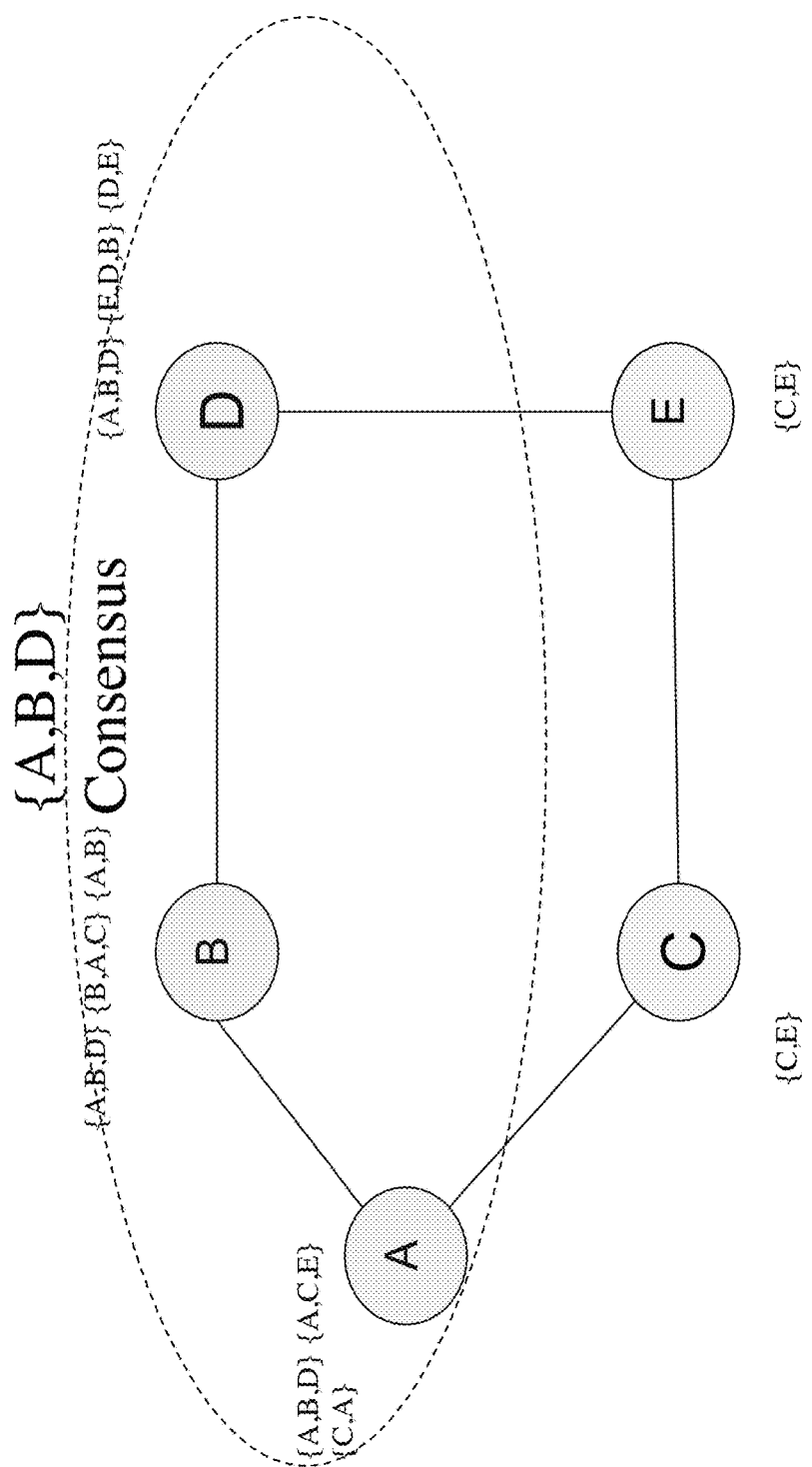

FIG. 5E illustrates the consensus formed between nodes A, B, and D. Candidate clusters {C,B,A} and {C,E,D } are removed from the queue of node C. Candidate cluster {E,C,A} and {E,D,B} are removed from the queue of node E.

Figure 5F:
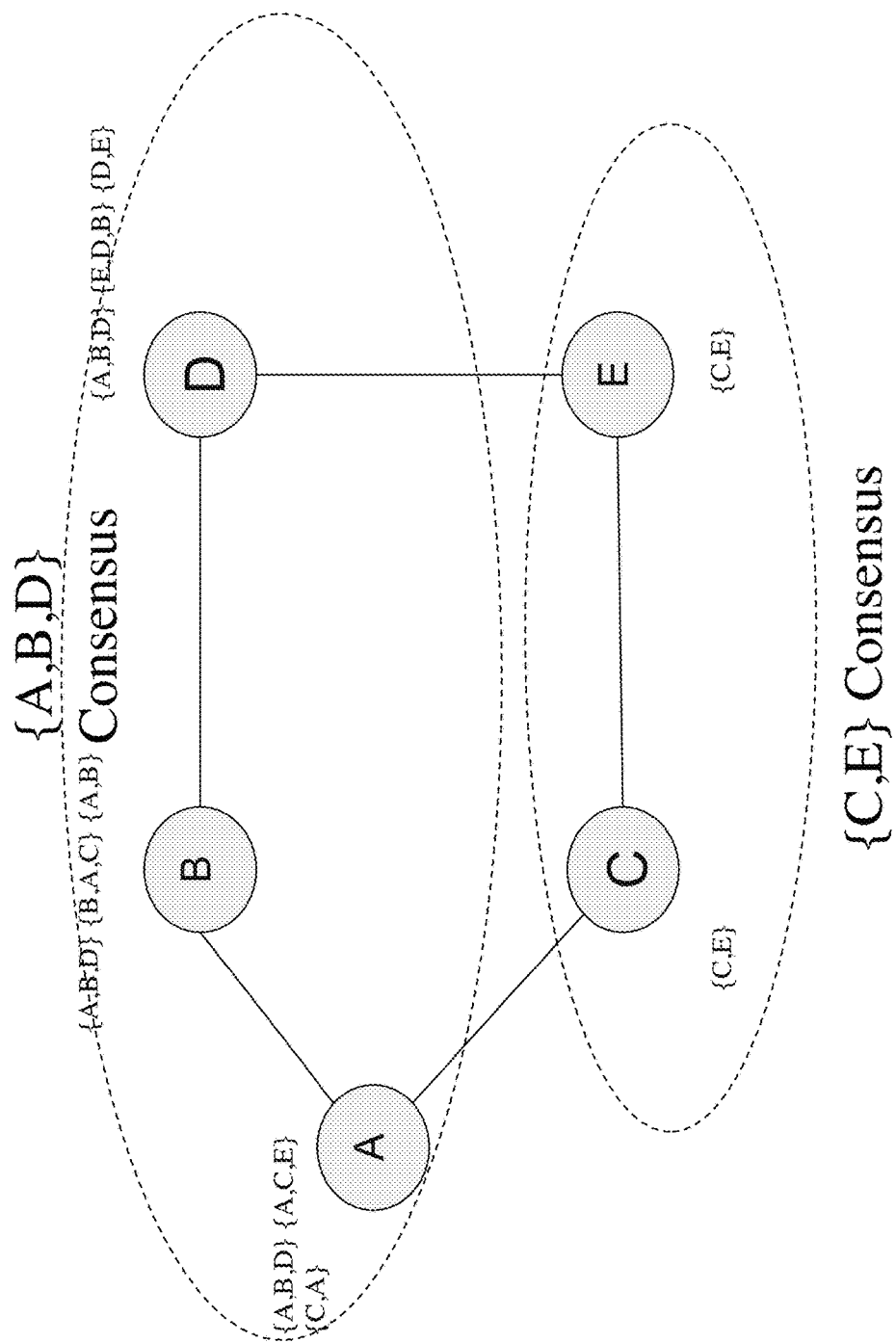

Referring back to FIG. 3, after one or more additional iterations, nodes C and E update the candidate clusters in their respective queues at 305, and a consensus analysis at 308 confirms that candidate cluster {C,E} is the top cluster for both nodes C and E, and a consensus is established that candidate cluster {C,E} should be designated as the final cluster for nodes C and E. This is illustrated in FIG. 5F.

Figure 6:
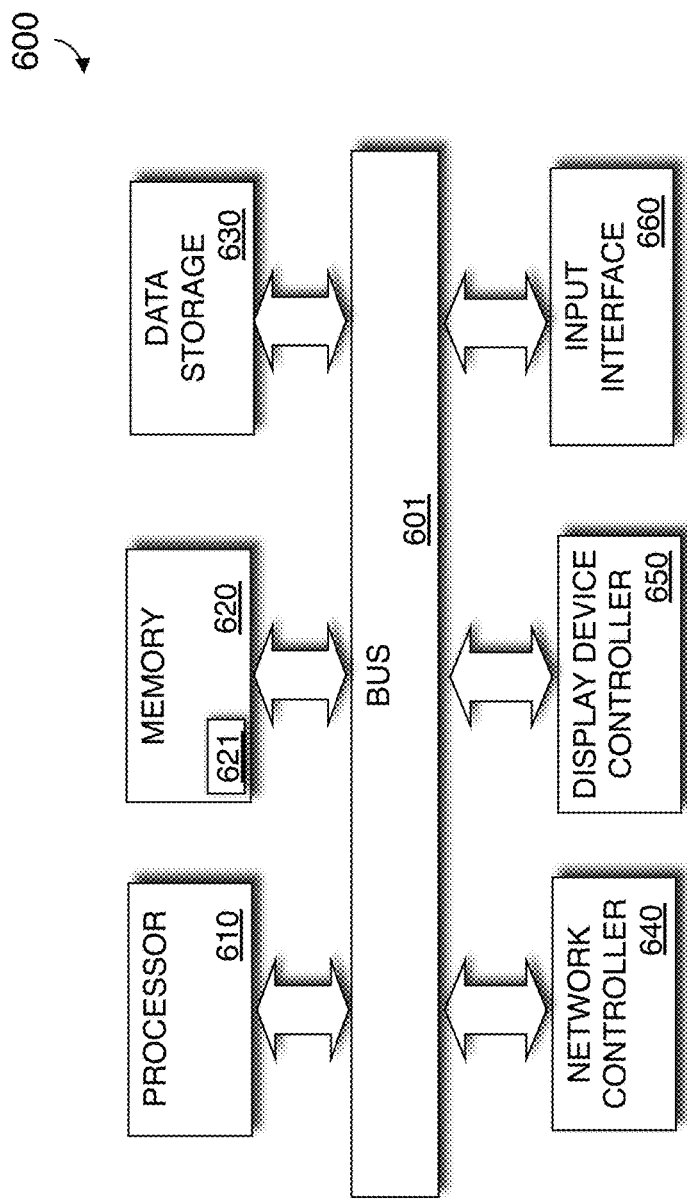
FIG. 6 illustrates a block diagram of a computer system implementing a system designer according to an exemplary embodiment of the present disclosure.

FIG. 6 is a block diagram of an exemplary computer system 600 in which an example embodiment of the present disclosure resides. The computer system 600 includes a processor 610 that process data signals. The processor 610 is coupled to a bus 601 or other switch fabric that transmits data signals between processor 610 and other components in the computer system 600. The computer system 600 includes a memory 620. The memory 620 may store instructions and code represented by data signals that may be executed by the processor 610. A data storage device 630 is also coupled to the bus 601.

A network controller 640 is coupled to the bus 601. The network controller 640 may link the computer system 600 to a network of computers (not shown) and supports communication among the machines. A display device controller 650 is coupled to the bus 601. The display device controller 650 allows coupling of a display device (not shown) to the computer system 600 and acts as an interface between the display device and the computer system 600. An input interface 660 is coupled to the bus 601. The input interface 660 allows coupling of an input device (not shown) to the computer system 600 and transmits data signals from the input device to the computer system 600.

A system designer 621 may reside in the memory 620 and he executed by the processor 610. The system designer 621 may operate to design a system by performing synthesis, placement, routing, and. timing analysis on the system. The system designer 621 may also identify a candidate cluster for a node in the system based on a gain value that quantifies a utility for the candidate cluster, and designate the candidate cluster as a final cluster for the node when the candidate cluster has a highest gain value among other candidate clusters for each node in the candidate cluster.

Figure 7:
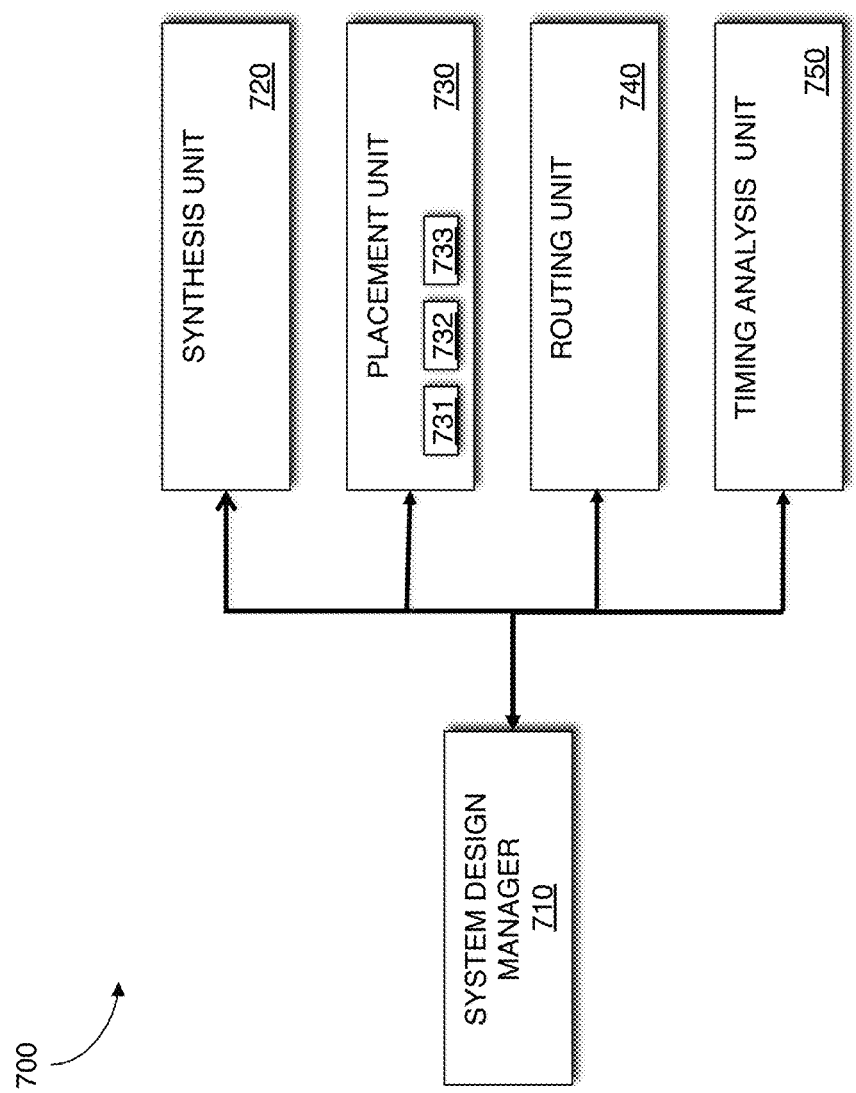
FIG. 7 is a block diagram of a system designer according to an exemplary embodiment of the present disclosure.

FIG. 7 illustrates a system designer 700 according to an embodiment of the present disclosure. The system designer 700 may be an EDA tool for designing a system on a target device such as an FPGA, structured application-specific integrated circuit (ASIC), or other circuitry. FIG. 7 illustrates modules implementing an embodiment of the system designer 700. According to one embodiment, the modules represent software modules and system design may he perforated by a computer system such as the one illustrated in FIG. 6 executing sequences of instructions represented by the modules shown in FIG. 7. Execution of the sequences of instructions causes the computer system to support system design as will be described hereafter. In alternate embodiments, hard-wire circuitry may be used in place of or in combination with software instructions to implement embodiments of present disclosure. Thus, embodiments of present disclosure are not limited to any specific combination of hardware circuitry and software. The system designer 700 includes a system designer manager 710. The system designer manager 710 is connected to and transmits data between the components of the system designer 700.

The system designer 700 includes a synthesis unit 720 that generates a logic design of a system to be implemented on the target device. According to an embodiment of the system designer 700, the synthesis unit 720 takes a conceptual HDL design definition and design constraints, and generates an optimized logical representation of the system The optimized logical representation of the system generated by the synthesis unit 720 may include a representation that has a reduced number of functional blocks and registers, such as logic gates and logic elements, required for the system. Alternatively, the optimized logical representation of the system generated by the synthesis unit 720 may include a representation that has a reduced depth of logic and that generates a lower signal propagation delay.

The synthesis unit 720 also performs technology mapping. Technology mapping involves determining how to implement the functional blocks in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as look up tables (LUTs), registers, block RAMS, Digital Signal Processing (DSP) blocks, input output elements, and/or other components.

The system designer 700 includes a placement unit 730 that processes the optimized technology-mapped netlist to produce a placement for each of the functional blocks. According to an embodiment of the present disclosure, the placement unit 730 performs basic logic element placement, physical clustering, cluster block placement, and detailed placement refinement as described in FIG. 2. The placement unit 730 includes a cluster identification unit 731 that identifies a legal candidate cluster for a node in the system based on a gain value that quantifies a utility for the candidate cluster. Every cluster that is formed is guaranteed to satisfy all the legality rules of the underlying target device architecture. It should be appreciated that the cluster identification unit 731 may identify a candidate cluster for each node in the system in parallel. The placement unit 730 includes a gain computation unit 732 that computes a gain value for legal candidate clusters in response to one or more number of pins shared between nodes in the candidate cluster, criticality and slack between the nodes in the candidate cluster, and a distance between the nodes in the candidate cluster. The placement unit 730 includes a consensus unit 733 that designates a candidate cluster as a final cluster for the node when the candidate cluster has a highest gain value among other candidate clusters for each node in the candidate cluster. The consensus unit 733 informs other nodes that nodes in the final cluster are not available for forming another candidate cluster.

The placement identifies which components or areas on the target device are to be used for specific functional blocks and registers. The placement unit 730 includes an initial placement unit 731 that performs an initial placement on the system using analytic placement, simulated annealing, and/or another procedure. According to an embodiment of the present disclosure, the initial placement unit 731 identifies clock regions projected for clock networks in the system from information of the clock network generated by the synthesis unit 720. During initial placement, components in the clock network may be placed with additional objectives of minimizing a size of the projected clock region, and/or minimizing a number of sectors on the target device crossed or occupied by the projected clock region. According to an embodiment of the present disclosure, initial placement places the system onto basic logic elements. These basic logic elements are assigned to be implemented by specific hardware on a target device. It should be appreciated that the placement unit 730 may include additional units/modules to perform the procedures described with reference to FIGS. 2-4. It should be further appreciated that clustering may be performed outside of placement. In these embodiments, the clustering-related modules described and illustrated within the placement unit 730 may also be implemented outside the placement unit 730.

The system designer 700 includes a routing unit 740 that determines the routing resources on the target device to use to provide interconnection between the components implementing functional blocks and registers of the logic design.

The system designer 700 includes a timing analysis unit 750. The timing analysis unit 750 performs timing analysis to determine whether timing constraints of the system are satisfied. The timing analysis unit 750 may direct modifications to he made to the design of the system in response to determining that timing constraints of the system are not satisfied.

The system designer manager 710 may perform an assembly procedure that creates a data file that includes the design of the system. The data file may be a bit stream that may be used to program he target device. The assembly procedure may output the data file so that the data file may be stored or alternatively transmitted to a separate machine used to program the target device. It should be appreciated that the assembly procedure may also output the design of the system in other forms such as on a display device or other medium.

It should be appreciated that embodiments of the present disclosure may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any pa.cular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 8:
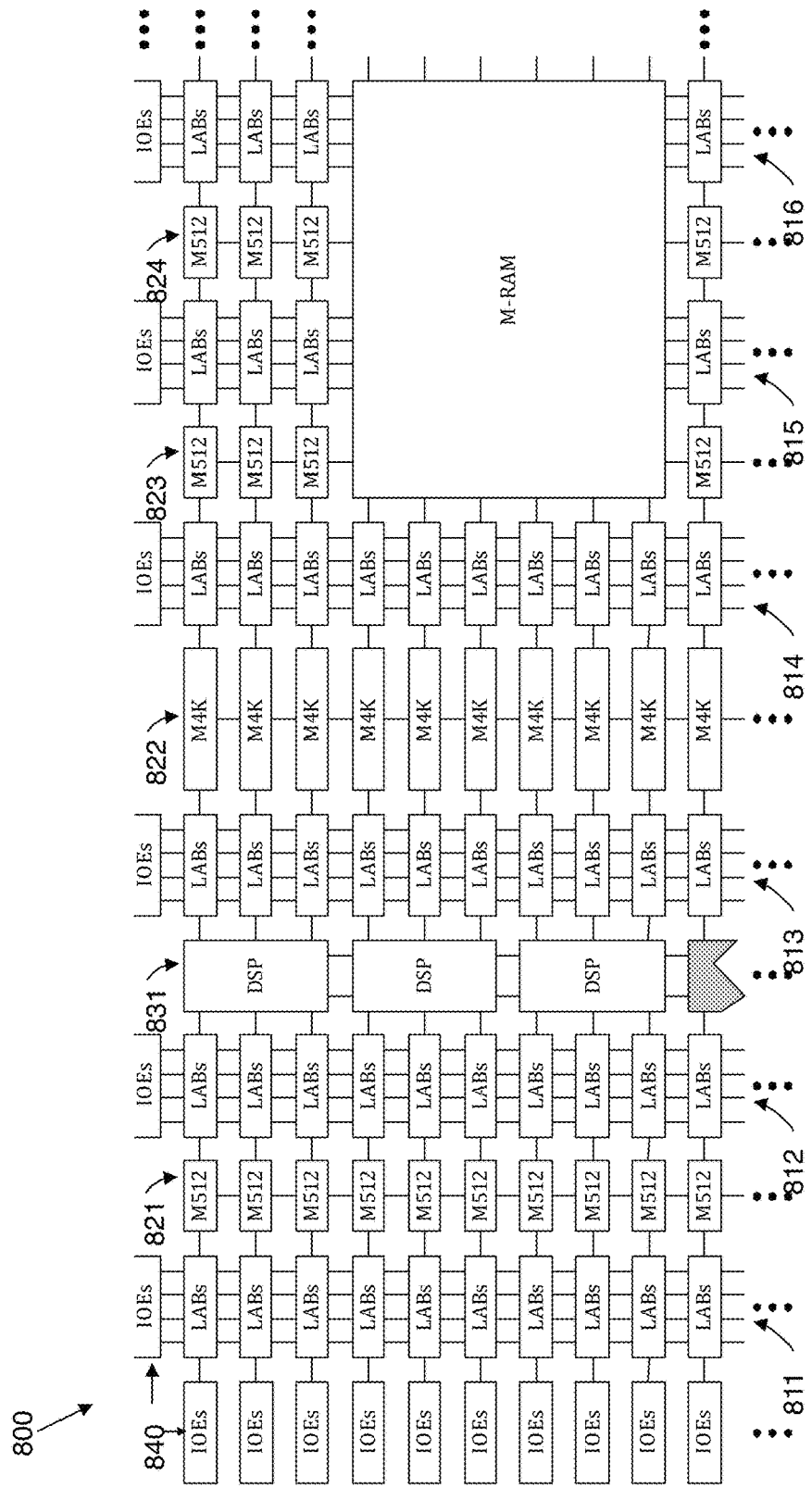
FIG. 8 illustrates an exemplary target device according to an exemplary embodiment of the present disclosure.

FIG. 8 illustrates a device 800 that may be used to implement a target device according to an embodiment of the present disclosure. The device 800 is a field programmable gate array (FPGA) that includes a plurality of logic-array blocks (LABs). According to an embodiment of the present disclosure, the device 800 may be implemented on a single integrated circuit. Each LAB may be formed from a plurality of adaptive logic modules (ALMs). Each ALM may be formed from a plurality of logic blocks, carry chains. LAB control signals, look up table (LUT) chain, and register chain connection lines. A logic block is a small unit of logic providing efficient implementation of user logic functions. A logic block includes one or more combinational cells, and registers. According to one embodiment of the present disclosure, the logic block may operate similarly to a logic element (LE), such as those found in the Stratix or Cyclone devices manufactured by Altera/Intel Corporation, or a combinational logic block (CLB) such as those found in Virtex/Ultrascale devices manufactured by Xilinx Inc. In this embodiment, the logic block may include a four input LUT with a configurable register. According to an alternate embodiment of the present disclosure, the logic block may operate similarly to an adaptive logic module (ALM), such as those found in Stratix devices manufactured by Altera Corporation, now owned by Intel Corporation. LABs are grouped into rows and columns across the device 800. Columns of LABs are shown as 811-816. it should be appreciated that the logic block may include additional or alternate components.

The device 800 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 800. Columns of memory blocks are shown as 821-824.

The device 800 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 800 and are shown as 831.

The device 800 includes a plurality of input/output elements (IOEs) 840. Each IOE feeds an IO pin (not shown) on the device 800. The IOEs 840 are located at the end of LAB rows and columns around the periphery of the device 800. Each IOE may include a bidirectional 10 buffer and a plurality of registers for registering input, output, and out-put-enable signals.

The device 800 may include routing resources such as LAB local interconnect lines, row interconnect lines ("H-type wires"), and column interconnect lines ("V-type wires") (not shown) to route signals between components on the target device. Although the exemplary device 800 illustrated in FIG. 8 is a FPGA, the present disclosure may be applied to ASICs, structured ASICs, and to any general digital circuit implementation.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. A method for designing a system on a target device, comprising:

identifying a candidate cluster for a node in the system based on a gain value that quantifies utility for the candidate cluster, wherein the candidate cluster includes programmable resources from the target device;

designating the candidate cluster as a final cluster for the node when the candidate cluster has a highest gain value among other candidate clusters for each node in the candidate cluster;

generating a data file that describes how the final cluster is placed and routed on the target device; and programming the target device with the data file to physically transform components on the target device to implement the system.

2. The method of claim 1, wherein the gain value for the candidate cluster accounts for a number of pins shared between the nodes in the candidate cluster.

3. The method of claim 1, wherein the gain value for the candidate cluster accounts for criticality and slack between the nodes in the candidate cluster.

4. The method of claim 1, wherein the gain value for the candidate cluster accounts for a distance between the nodes in the candidate cluster.

5. The method of claim 1, wherein identifying the candidate cluster comprises:

receiving one or more candidate clusters from neighboring nodes;

adopting the one or more candidate clusters from the neighboring nodes as candidate clusters of the node;

identifying a gain value for each of the candidate clusters of the node; and designating a predetermined number of the candidate clusters of the node with a highest gain value as candidate clusters of the node.

6. The method of claim 1 further comprising informing other nodes that nodes in the final cluster are not available for forming another cluster.

7. The method of claim 1, wherein the candidate cluster for each node in the system is identified in parallel.

8. The method of claim 1, wherein the node comprises a basic logic element.

9. The method of claim 1, wherein the node comprises one of a look up table and a register.

10. The method of claim 1, wherein the identifying of the candidate cluster for the node is performed by a first processor thread.

11. The method of claim 10 further comprising identifying a candidate cluster for a neighboring node by a second processor thread.

12. The method of claim 11 further comprising having the first and second processor threads share identities of the candidate cluster for the node and identities of the candidate cluster for the neighboring node with one another.

13. The method of claim 10, wherein the candidate clusters for each node in the system are identified in parallel.

14. The method of claim 10, wherein identifying the candidate clusters for a node further comprises:

identifying a gain value for each of the candidate clusters of the node; and designating a predetermined number of the candidate clusters of the node with a highest gain value as candidate clusters of the node.

15. The method of claim 10 further comprising informing other nodes in the system that the plurality of nodes are not available for forming another cluster.

16. A method for designing a system on a target device, comprising:

identifying candidate clusters for each node in the system, wherein identifying a candidate cluster for a node includes receiving one or more candidate clusters from neighboring nodes and adopting the one or more candidate clusters from the neighboring nodes as candidate clusters of the node;

identifying a final cluster for a plurality of nodes where the cluster includes each of the plurality of nodes and has a highest gain value among other candidate clusters for each of the plurality of nodes;

generating a data file that describes how the final cluster is placed and routed on the target device; and programming the target device with the data file to physically transform components on the target device to implement the system.

17. A system designer comprising:

a cluster identification unit that identifies a candidate cluster for a node in the system based on a gain value that quantifies a utility for the candidate cluster;

a gain computation unit that computes a gain value for the candidate cluster in response to one of a number of pins shared between the nodes in the candidate cluster, a criticality and slack between the nodes in the candidate cluster, and a distance between the nodes in the candidate cluster; and a consensus unit that designates the candidate cluster as a final cluster for the node when the candidate cluster has a highest gain value among other candidate clusters for each node in the candidate cluster, wherein the astern designer generates a data file that describes how the final cluster is placed and routed on a target device, and programs the target device with the data file to physically transform components on the target device to implement the system, wherein the target device is a field programmable gate array implemented on an integrated circuit.

18. The system designer of claim 17, wherein the consensus unit informs other nodes that nodes in the final cluster are not available for forming another candidate clusters.

19. The system designer of claim 17, wherein the cluster identification unit identifies a candidate cluster for each node in the system in parallel.

* * * * *